US009535113B1

(12) United States Patent
Grosch et al.

(10) Patent No.: US 9,535,113 B1
(45) Date of Patent: Jan. 3, 2017

(54) DIVERSIFIED EXERCISER AND ACCELERATOR

(71) Applicant: International Business Machines Corporation, Armonk, NY (US)

(72) Inventors: David A. Grosch, Burlington, VT (US); Gregory V. Miller, South Burlington, VT (US); Brian C. Noble, Lagrangeville, NY (US); Ann L. Swift, Richmond, VT (US); Joel Thomas, Granby (CA); Jody J. Van Horn, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/003,249

(22) Filed: Jan. 21, 2016

(51) Int. Cl.
*G01R 31/02* (2006.01)
*G01R 31/28* (2006.01)
*G01R 31/26* (2014.01)

(52) U.S. Cl.
CPC ....... *G01R 31/2875* (2013.01); *G01R 31/2601* (2013.01); *G01R 31/2858* (2013.01); *G01R 31/2863* (2013.01)

(58) Field of Classification Search
CPC .............. G01R 31/2601; G01R 31/025; G01R 31/2621; G01R 31/2855; G01R 31/2896; G01R 31/2874; G01R 31/26; G01R 31/2607; G01R 31/12; G01R 31/3187; G01R 31/318371; G01R 31/318547; G01R 31/31703; G01R 31/31727

USPC .............. 324/551, 760, 765, 750.05, 762.01, 324/762.05, 760.01–763.01, 719, 324/71.5, 757.01–757.05; 714/733, 738, 714/718, 735
See application file for complete search history.

(56) References Cited

U.S. PATENT DOCUMENTS

| | | | |
|---|---|---|---|
| 5,822,218 A | 10/1998 | Moosa et al. | |
| 6,326,800 B1 * | 12/2001 | Kirihata | G01R 31/287 324/750.05 |
| 6,574,763 B1 * | 6/2003 | Bertin | G01R 31/287 324/750.05 |
| 7,065,676 B1 | 6/2006 | Lang et al. | |
| 7,493,541 B1 | 2/2009 | Agrawal et al. | |
| 9,064,087 B2 | 6/2015 | Bickford et al. | |

(Continued)

FOREIGN PATENT DOCUMENTS

JP 2011243137 A 12/2011

*Primary Examiner* — Jermele M Hollington
*Assistant Examiner* — Taqi Nasir
(74) *Attorney, Agent, or Firm* — Scully, Scott, Murphy & Presser, P.C.; Kenneth Corsello, Esq.

(57) ABSTRACT

A method, apparatus and computer program product for testing semiconductor products that combines multiple techniques. Depending on the requirements, different ones of the techniques are emphasized over the other techniques. The testing applies a technique to achieve a higher single defect acceleration parameter at the expense of a second parameter, thus enabling acceleration of defects that require higher voltage or higher temperature than a traditional "Burn In" can achieve, which defects would otherwise go unaccelerated. The method manages the adaptation of the different techniques, e.g., how it decides to favor one technique over the other, and how it carries out the favoring of one or more particular techniques in a given test situation. Thus, acceleration to defectivity (defect type and quantity) may be tailored in real time by uniquely leveraging the duration spent in a given section of a process flow based on the prevalence of unique defect types.

20 Claims, 4 Drawing Sheets

(56) References Cited

U.S. PATENT DOCUMENTS

2007/0139064 A1* 6/2007 Whipple ............ G01R 31/2874
                                                324/750.03
2007/0170934 A1* 7/2007 Ma ..................... G01R 31/2831
                                                324/754.14
2015/0039244 A1   2/2015 Bernstein

* cited by examiner

DIVERSIFIED EXERCISER AND ACCELERATOR

FIELD

The present disclosure relates generally to semiconductor manufacturing techniques and particularly to system and methods for accelerating and detecting the plethora of defect types at the plant of manufacture.

BACKGROUND

Technology advances and integration of a broad spectrum of IP continues to push the limits of power in all semiconductor applications. The diversity of defect types is compounding, driven by the pace of semiconductor processing complexity and IP integration. The plethora of defect types poses severe challenges to the mandate to enhance product quality and reliability with each new product release to the marketplace. Accelerating and detecting these defects at the plant of manufacture is paramount to achieving the demands of the marketplace.

Traditional semiconductor device manufacturing techniques, e.g., "burn-in" techniques, of applying a stress uses "combinational" stimuli (e.g., high voltage and high temperature applied simultaneously) and sustained for the stress duration. Defects accelerated primarily by voltage (i.e. electromigration) or primarily by thermal cycle (i.e. metal fatigue) are sub optimally stressed. An example of electromigration calculations highlights the need for maximum achievable voltage. Lower voltages require unachievable durations. Higher voltage accelerates this defect type most effectively, so reducing temperature to increase voltage enables users to accelerate defects that are "escapes" to stress at lower temperature.

Currently there exist no techniques that can be used to perform a specific optimization of stimulus, observe-ability, and/or acceleration of defects in general or specific defects. Nor are there specific techniques for integrated stimulus, observe-ability, and/or acceleration applied techniques towards an optimized defect specific process.

Accelerating this growing kaleidoscope of latent defects, against a backdrop of increasing power, circuit, and process complexity, demands a kaleidoscope of acceleration solutions.

SUMMARY

A system, method and computer program product for lowering latent defect failure rates in semiconductor technologies thru an integration of varied unique acceleration solutions targeted at specific accelerators most effective on an array of diverse defects.

In one embodiment, the system and methods integrate varied unique acceleration techniques that include homogenized optimization and also include specific optimization to achieve a higher single acceleration parameter at the expense of a second parameter. This technique enables the acceleration of defects that require higher voltage or higher temperature than the homogenized optimization can achieve; otherwise, these defects would go unaccelerated and become reliability hazards.

The system and methods also offer flexibility to tailor acceleration to defectivity (defect type and quantity) in real time by uniquely leveraging duration spent in a given section of the process flow based on the prevalence of unique defect types.

Thus, in one aspect, there is provided a method for testing semiconductor products. The method comprises: applying, to a semiconductor product, first test voltage and temperature stimuli based on acceleration condition parameters, the parameters comprising a temperature acceleration condition parameter and voltage acceleration condition parameter, at corresponding acceleration condition levels, the first test stimuli for detecting one or more known latent defects in the semiconductor product; collecting production results from the applying the first test stimuli; applying to the semiconductor product, test stimuli in succession, and varying, at each successive application, one or more of: a temperature acceleration condition parameter, a voltage acceleration condition parameter or both temperature and voltage acceleration condition parameters, each successive application of test stimuli applied for inducing an acceleration of a semiconductor product defect, the varying comprising applying, at one or more of the successive applications, a combination of an increased first acceleration condition parameter and/or acceleration condition level and decreasing a second acceleration condition parameter and/or acceleration condition level parameter; collecting production results from the applying further test stimuli at each the successive application; and detecting, based on the collected production results for each the first and successive application of test stimuli, a previously unknown semiconductor product defect.

In a further aspect, there is provided an apparatus for testing semiconductor products. The apparatus comprises: a processor device; a memory storage device storing instructions, the instructions for configuring the processor device to perform a method to: control applying, to a semiconductor product, first test voltage and temperature stimuli based on acceleration condition parameters, the parameters comprising a temperature acceleration condition parameter and voltage acceleration condition parameter, at corresponding acceleration condition levels, the first test stimuli for detecting one or more known latent defects in the semiconductor product; collect production results from the applying the first test stimuli; control applying to the semiconductor product, test stimuli in succession, and varying, at each successive application, one or more of: a temperature acceleration condition parameter, a voltage acceleration condition parameter or both temperature and voltage acceleration condition parameters, each successive application of test stimuli applied for inducing an acceleration of a semiconductor product defect, the varying comprising applying, at one or more of the successive applications, a combination of an increased first acceleration condition parameter and/or acceleration condition level and decreasing a second acceleration condition parameter and/or acceleration condition level parameter; collect production results from the applying further test stimuli at each the successive application; and detect, based on the collected production results for each the first and successive application of test stimuli, a previously unknown semiconductor product defect.

In a further aspect, there is provided a computer program product for performing operations. The computer program product includes a storage medium readable by a processing circuit and storing instructions run by the processing circuit for running a method. The method is the same as listed above.

BRIEF DESCRIPTION OF THE DRAWINGS

Preferred embodiments of the invention will now be described, by way of example, with reference to the accompanying drawings.

DETAILED DESCRIPTION OF THE PREFERRED EMBODIMENTS

Figure 1:
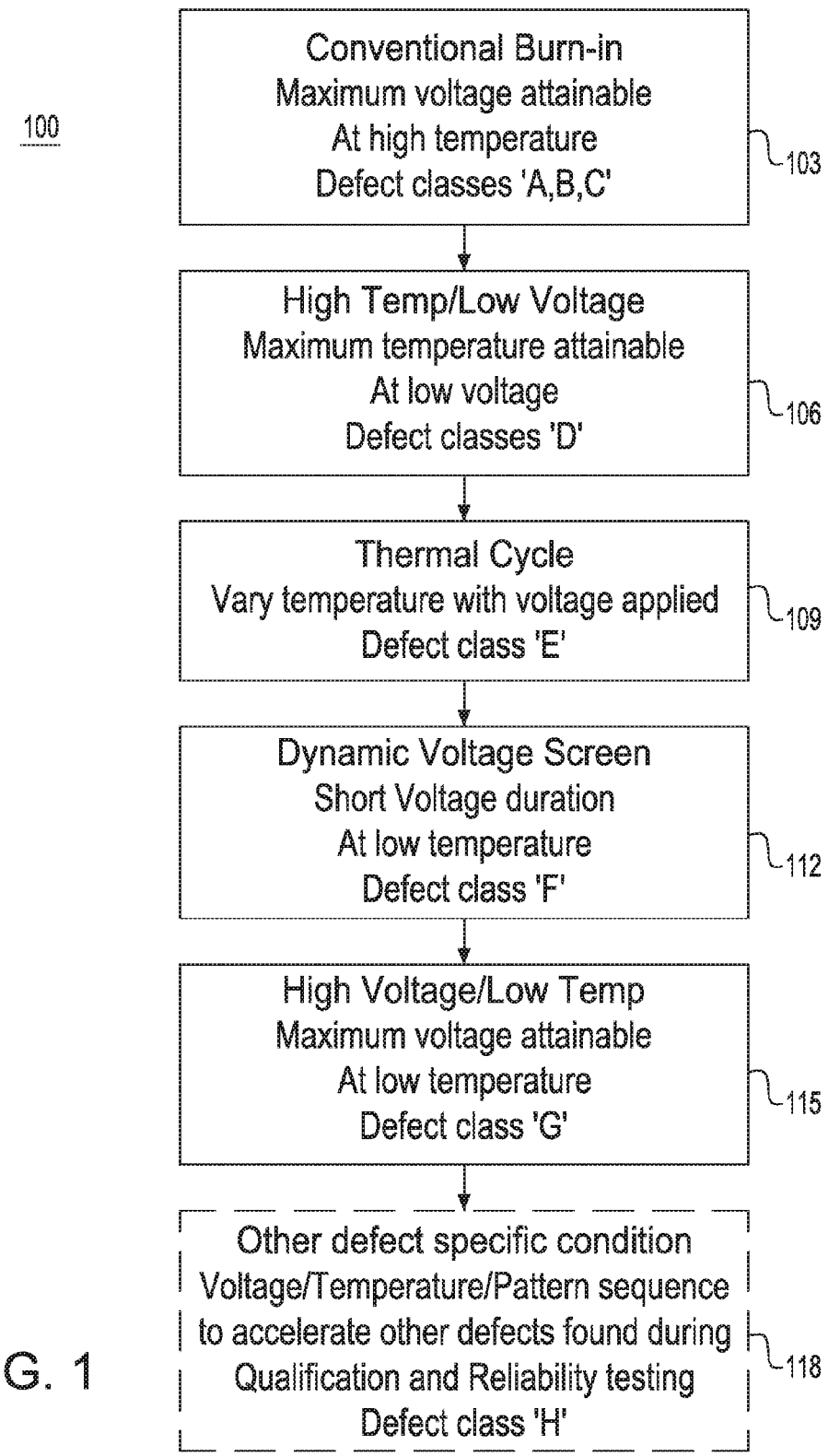
FIG. 1 depicts a manufacturing production process flow used for detecting latent design failures of any electronic system, circuit, or product in one embodiment.

According to an embodiment of a first aspect of the present invention, a system and method integrates varied unique acceleration techniques that include homogenized optimization and also include specific optimization to achieve a higher single acceleration parameter at the expense of a second parameter. For example, a higher voltage is achieved when the stress temperature is lowered; or achieving a higher temperature by lowering voltage). This technique enables the acceleration of defects that require higher voltage or higher temperature than the homogenized optimization can achieve. These defects would otherwise go unaccelerated and become reliability hazards).

The system and method offers flexibility to tailor acceleration to defectivity (i.e., a defect type and quantity) in real time by uniquely leveraging duration spent in a given section of the process flow based on the prevalence of unique defect types.

For example a prevalence of defects subject to metal fatigue or hysteresis effects would trigger increased duration spent in the controlled power induced In-situ thermal cycle section where test patterns are applied during power induced thermal cycling. The sequential combination of defect-specific accelerating techniques causes latent defects to become manifest that would escape conventional acceleration processes.

In one aspect, a technique is provided to actually lower latent defect failure rates on products in manufacturing by: a) choosing parameters that are optimal for specific failure mechanisms; and b) increasing one applied parameter while decreasing another to affect a shorter duration to fail while preventing escapes for a specific failure mechanism. To this aspect, a "specific optimization" technique is run where any defect targeted accelerator or detection (i.e. patterns, timing, mechanical stress, etc.) contribute to the novel integration of varied unique acceleration techniques that include homogenized optimization and also include specific optimization to achieve a higher single acceleration parameter at the expense of the second parameter.

The increased voltages and temperatures achieved thru 'specific optimization' versus 'homogenized optimization' accelerates defects in reduced time as compared to known solutions. In addition to defect specific applied conditions (Voltage, Temperature, Timing) sections of the stress process can include any defect targeted accelerator or detection (i.e. patterns).

Different classes of defects are best accelerated by different applied conditions. One class of defects is best accelerated by high temperature; a second class is best accelerated by voltage; and a third class of defects is best accelerated by "Insitu Thermal Cycle". Other defect classes require unique patterns to provide access to stimulate, observe, and accelerate the defect. Defect unique patterns are another section of the 'specific optimization' sequence. "Specific Acceleration" sections are added as process, design, and applications introduce new and unique defect types and classes.

The systems and methods enable multiple defect classes to be optimally accelerated. In many defect cases, the systems and methods provide stimulus, observe-ability, and acceleration that cannot be achieved otherwise, and would therefore result in defects escaping and becoming manifest as quality and/or reliability hazards in the marketplace.

FIG. 1 shows a manufacturing production process flow 100 used for detecting latent design failures of any electronic system, circuit, or product in one embodiment.

In FIG. 1, a first step 103 is the application of burn-in (BI) conditions to the UUT. Such conditions and voltage stimuli applied may vary depending upon the type of UUT being tested for defects. In one embodiment, a maximum voltage is applied at "high" temperature conditions (e.g., relative to room temperature). The "conventional" burn-in conditions are used to detect known "A", "B", or "C" class defects which are shorting defects.

A further step 106 is another burn-in condition which is a combination of the application of a maximum temperature attainable while applying a low voltage condition. These conditions are used to detect a known "D" class defect which corresponds to a gate oxide and/or BTI (bias temperature instability) defect.

A further step 109 is another burn-in condition which is a combination of thermal cycling (varying temperature conditions) while applying a voltage. These conditions may be used to detect an "E" class defect which corresponds to a metal fatigue defect (e.g., metal stringers, vias, etc.).

A further step 112 is the dynamic voltage screen test applied to the UUT in which voltages are applied to the UUT for short time durations, while applying a low temperature condition. These conditions may be used to detect a "F" class defect which corresponds to a duty cycle accelerated defect (e.g., a combination of A, B, C and E defects).

A further step 115 is another burn-in condition which is a combination of applying a high voltage, e.g., a maximum voltage attainable, while applying a low temperature condition. These conditions may be used to detect a "G" class defect corresponding to metal puddle defect (such as resulting from CMP or polishing defects).

In one embodiment, a further method step 200 may be run during the process flow 100 of FIG. 1 to detect another defect specific condition by applying and varying combinations of voltage/temperature/pattern sequences to accelerate other defects such as found during any prior performed qualification and reliability testing. Any "new" defect detected is characterized as a "H" class defect as shown in FIG. 1.

Figure 2:
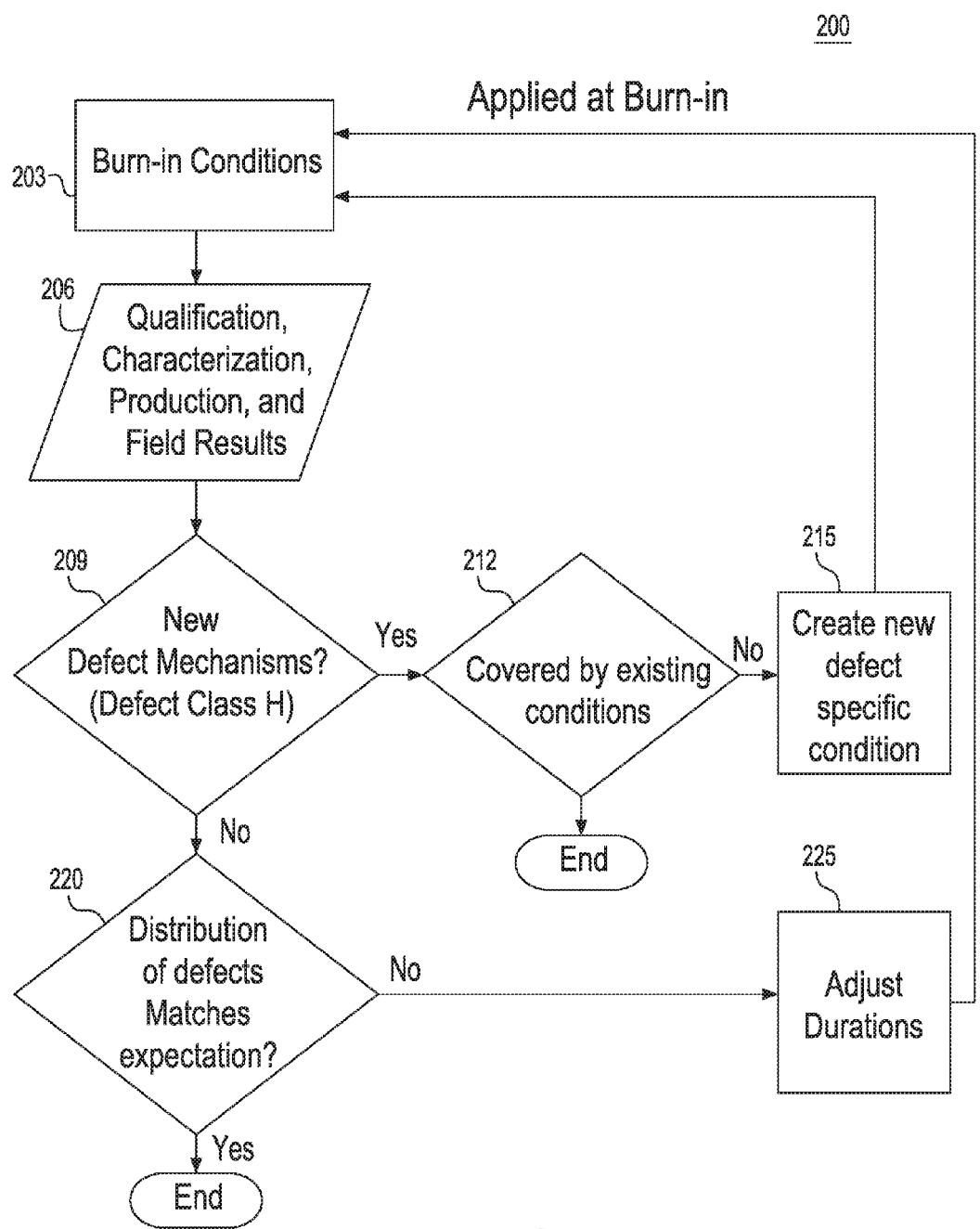
FIG. 2 particularly depicts a process flow for lowering latent defect failure rates of a product thru an integration of varied unique acceleration solutions in one embodiment.

FIG. 2 particularly depicts a process 200 for lowering latent defect failure rates of a product, e.g., semiconductor technologies, thru an integration of varied unique acceleration solutions targeted at specific accelerators most effective on an array of diverse defects. While specific examples described herein are directed to semiconductor devices, the principles herein can be applied to detect defects of any electronic system, circuit, or product to detect latent design failures.

Figure 3:
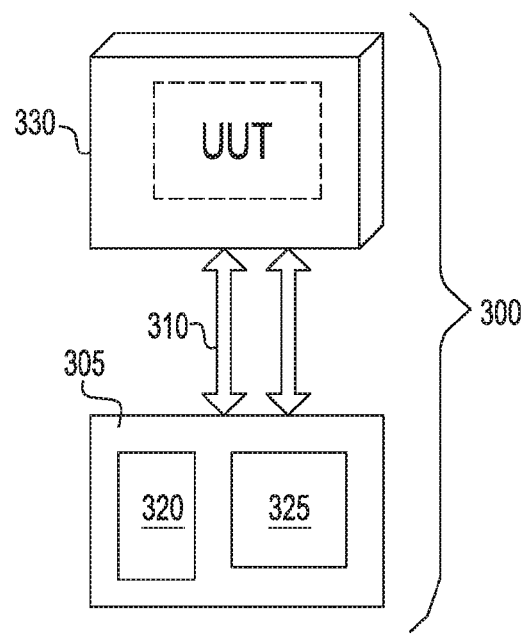
FIG. 3 depicts a generic apparatus for applying computer controlled burn-in conditions of voltage and temperature.

FIG. 3 depicts an apparatus 300 for applying burn-in (BI) conditions of voltage and temperature to a unit under test (UUT), e.g., a semiconductor product such as an integrated circuit. In one embodiment, system 300 includes a computing element such as a computing system 305 that includes a programmed processor 320 and a corresponding memory 325 having software program instructions for programming the processor to perform the methods of FIG. 1 and FIG. 2. Computing system 305 is further in communication, e.g., directly or via a network, with a conventional testing apparatus 330 used to apply "burn-in" testing conditions as typically used for reliability product testing and latent fault detection. Apparatus thus may include a housing or like an enclosed structure in which the UUT is located that is configured with the instruments (e.g., electronic signal generators, voltage generators, volt/current meters, temperature heating/cooling devices, etc.) and automated test equipment to interface with the product and that receive control signals 310 for applying burn-in stress conditions and related stimuli, i.e., create the voltage inputs and control environmental temperature conditions, to the UUT.

In one embodiment, the method of FIG. 2 integrates varied unique acceleration techniques that include "homogenized optimization" (e.g., conventional burn-in conditions) and also include specific optimization to achieve a higher single acceleration parameter at the expense of a second parameter. Parameters include a temperature, a voltage condition, or both and stress level degree, e.g., greater or lower than a like conventionally applied "burn-in" condition/stress level. This technique enables the acceleration of defects that require higher voltage or higher temperature than the homogenized optimization can achieve; otherwise, these defects would go un-accelerated and become reliability hazards.

The process 200 of FIG. 2 particularly is run for identifying new defect specific conditions (i.e., exercisers and accelerators). In one embodiment, the new defect classes are identified through use of continuous adaptive feedback. Once the new defect class is identified and the new defect exercisers and accelerators are created, then a new process block is added, e.g., as step 118 of FIG. 1 ("defect class H") for the "new" defect specific condition.

In addition to identifying new defect classes and creating exercisers and accelerators specific to the new defect class, the system 300 also recognizes changes in distribution of defects (i.e. a particular defect class commands a higher percentage of the overall kaleidoscope of defect classes). Once a change in defect distribution is recognized, the disclosed process adjusts/optimizes in real time the applied conditions (i.e., specific details of the exercisers and accelerators) such that the predominant defect class receives more optimized applied conditions and/or increased duration (i.e., the time spent in the block in the process flow 100 in FIG. 1 may be increased to match the increase in occurrences of a particular defect (defect distribution).

Referring to FIG. 2, a first step 203 is applying unique acceleration burn-in conditions to the unit under test (UUT), e.g., a semiconductor chip or circuit or like electronic product. This step includes applying the manufacturing process flow 100 burn-in steps 103-115 shown in FIG. 1. It is understood that these blocks may be run in the order as depicted, or a varying order as applied conditions vary dependent upon defect class, technology, and maturity of the production process. Results data from these BI tests from every block 103-115 are analyzed and decisions are made for every block, which may further result in adding a new BI step 118 (i.e. defect class H).

Then, in FIG. 2, after performing the particular types of burn-in conditions 103-115 of FIG. 1, the data collected from the result of burn-in conditions are generated and output for analysis at step 206 by the computer system of FIG. 3. The collected data include, but are not limited to. Such data may include qualification, characterization, production and field results which are stored in a data storage system, e.g., a memory storage device, and used for the detecting of new defect mechanisms.

In one embodiment, the collected "qualifications" data is the data and information collected on the defects that were present when the technology and/or product (design) was qualified prior to starting a volume manufacturing/production. This information provides the foundation for defect types, their specific exerciser and acceleration burn-in (BI) conditions, and their distribution.

The "characterization" data is the determining of the applied conditions that accelerate a defect. The "production" data is the results of the Burn In process applied to production volumes at the prior step 203 and the analyzing of the data collected. The "Field Results" data is the data resulting from analyzing any failures that occur in a customer's application.

For every applied burn-in condition of process flow 100 applied at 203, the method analyzes the collected qualifications, characterization, production, and/or field results data at 206, and determines at 209 whether any new defect has been detected based on the qualification, characterization, production and field results considered. For example, based on a result of applied conditions, a unique defect may be detected, e.g., a frequency, edge placement error.

In one embodiment, if the product is new and as part of its initial bring-up, while the process is being developed, the analyzing of the collected qualifications, characterization, production, and/or field results may be a manual process. Since a Burn In production run can be greater than 24 hours, a manual analysis of real time data can result in a change to the Burn-In production during the Burn In production run at 203, i.e., in real time. As the process matures and experience is gained, the analyzing, comparing, and taking action on scenarios that have occurred during the development phase may be automated. In one embodiment, any anticipative actions may also be coded, e.g., based on the experience of the analysis team.

In one embodiment, the qualification, characterization, production and field results information obtained at 206 is compared to the latest or most recent production results to determine if the latest production is exhibiting new defect types or new distributions of old defects.

For example, in one embodiment, a yield loss induced at each sector of the process flow may be analyzed. The applied conditions for each sector with loss is then further analyzed to determine if the defect mix has changed as compared to the Qualification data. If for example, high Voltage/Low Temp is finding higher losses, then the defects are sent thru physical failure analysis while the program is modified to increase voltage in that section to determine if the defect type has saturated with the original applied conditions or if increased conditions are appropriate Based on the compared production results, if a new defect mechanism is detected it is characterized as a new class "H"-type defect (e.g., an edge placement error), and may become a new step of the existing process flow. If a new defect is detected from analysis at 209, the process proceeds to step 212 where a determination is made based on the collected qualification, characterization, product and field results data whether the new defect is already covered by existing conditions. If a new defect is covered by existing conditions, then no action is required, and the process may return to 203 and/or end. If a new defect is not covered by existing conditions, then a new defect specific condition is created at 215 and this new defect specific burn in condition, i.e., the specific voltage/temperature/pattern sequence, is applied to the UUT by returning to step 203.

Returning to step 209, if there is no new defect detected, then the process proceeds to step 218 to obtain a defects distribution metric, and make a determination as to whether a distribution of the defects matches expectations. In one embodiment, a change in defect distribution may be recognized by increased losses for a given burn-in condition of the process flow 100 of FIG. 1, e.g., as compared to the qualification data and historical production data. One example of a change not meeting expectations is when during a qualification, the loss for "thermal Cycle" was 1%, and in production, the loss for Thermal Cycle burn-in conditions was a consistent 0.8% over time (thus meeting expectations), however in a subsequent production run, suddenly the loss percentage for the Thermal Cycle burn-in conditions step shoots up to 3% indicating a change in the distribution metric for that defect.

If, at 220, the distribution of the defects fails to match expectations, then the process proceeds to 225 where durations are adjusted, i.e., the durations of a given burn-in test block of FIG. 1. Otherwise, if the distribution of the defects matches expectations, then no action is required, and the process may return to 203 and/or end.

In one embodiment, the adjustment of durations can be increasing duration or decreasing duration depending upon the production data. The "best" applied condition(s) to exercise or accelerate the defect is not known until it is characterized and those exercisers and accelerators determined. Traditional Burn-In uses voltage and temperature as exercisers and accelerators in a homogenous fashion (i.e., applying high voltage and a high temperature condition, simultaneously, as shown at process block 103 of process flow 100). A particular defect type may be accelerated by temperature only, hence the process block 106 of process flow 100 (e.g., providing a High Temp/Low Voltage BI condition). Another defect type is best accelerated by a thermal cycling BI condition, hence the process block 109 of process flow 100, and some defect types are best accelerated by voltage alone, hence the process block 115 of process flow 100. As process 200 identifies new defect types, they may be best accelerated by parameters not used as accelerators previously.

Such acceleration may be based on new test burn-in parameters such as, but not limited to: frequency or rise time/fall time or edge placement of a voltage spike, or some other applied condition. As those applied conditions are determined, process 200 creates a new defect specific condition at 215, FIG. 2, and then a new block 118 is added to the process flow 100 of FIG. 1. Analysis of the distribution of defects may cause the process 200 to adjust/optimize the applied conditions or adjust/optimize the time durations of the applied conditions at step 225, for any of the blocks of process flow 100.

The process then proceeds back to 203 to re-apply burn-in conditions, i.e., applying voltage/temperature/pattern sequences at the adjusted durations, to the UUT.

Figure 4:
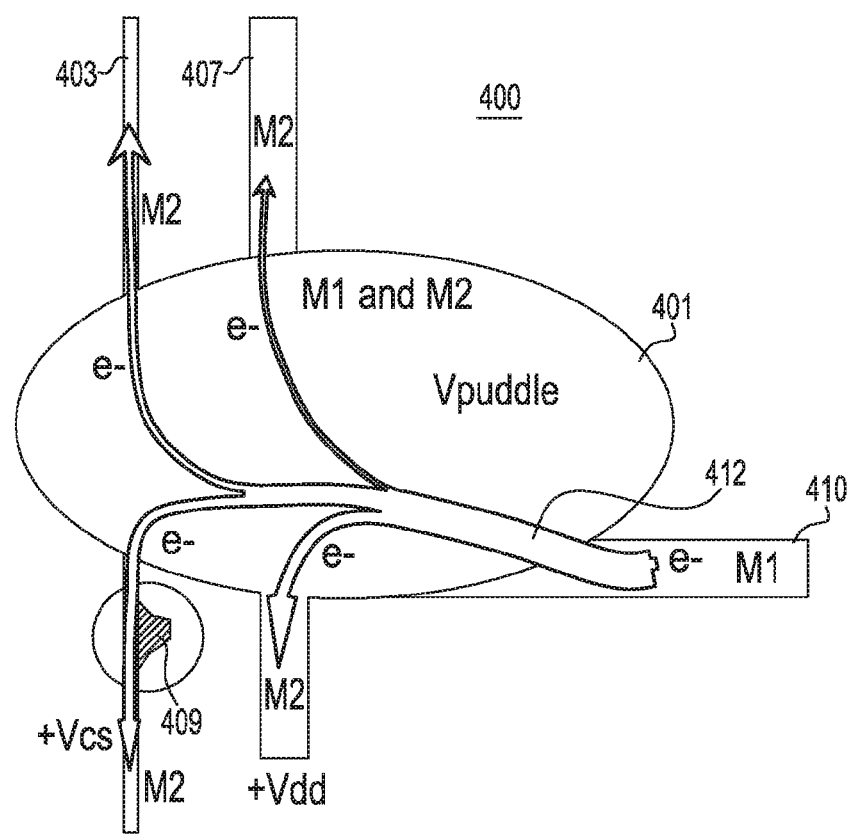
FIG. 4 depicts an example application of the method of FIGS. 1 and 2 for adjusting Voltage and Temperature conditions for accelerating detecting a Large Shorting Defects in a semiconductor product.
Figure 5:
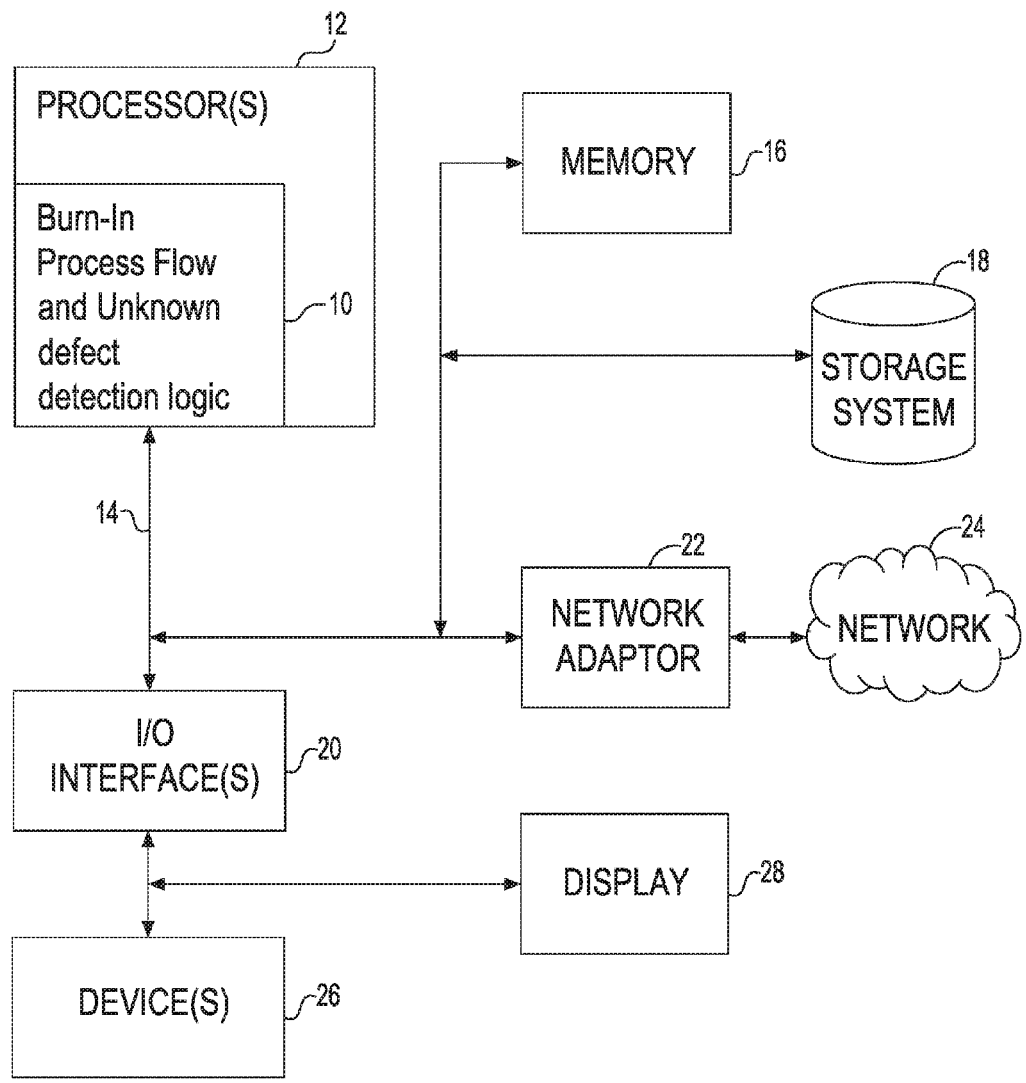
FIG. 5 illustrates a schematic of an example computer or processing system of FIG. 3 for implementing the methods depicted in FIGS. 1 and 2.

FIG. 4 depicts an example electromigration analysis performed for accelerating detection of a "new" semiconductor product defect type such as a large shorting defect. In particular, FIG. 4 shows a manufacturing fault, e.g., an extrusion 409 causing a large shorting defect embodied as a conductive material puddle 401 (e.g., metal) that electrically shorts three metal conductors: a first metal conductor 410 at a first metal level M1, a second metal conductor 403 at a second metal level M2, and a third metal conductor 407 at the second metal level M2. Current flow shown as flow 412 is depicted in FIG. 4 as sourced from the first metal conductor 410 through the metal puddle defect 401 to the second and third metal conductors 403, 407.

In this example, the interaction of voltage (V), temperature (T), and current (C) is according to the following equations:

$$r_0 = \rho_0 \frac{l}{tw}(1 + \beta \Delta T)$$

used to represent a resistance of a metal line 410, 407, 403 given current density, thickness, width and temperature parameters; and $$I_i = \frac{(V_i - V_p)}{r_i} \text{ and } r1 = \frac{r1a * r1b}{r1a + r1b}, r2 = \frac{r2a * r2b}{r2a + r2b}$$

used to represent a current flow in each conductive metal line 410, 407, 403 given voltage and a resistance measure of each line. Thus for example, r1 is a computation of a resistance value in metal line 410; r2 is a computation of a resistance value in metal lines 403, 407 where $V_i$ is a voltage at each respective metal line and $V_p$ is the voltage at the puddle; and $$i = \sum_{i=1}^{3} I_i = 0; \frac{(V1 - V_p)}{r_1} + \frac{(V2 - V_p)}{r_2} + \frac{(V3 - V_p)}{r_3} = 0$$

which is Kirchoff's law used to compute the value of the puddle voltage $V_p$ given the resistances of each metal line and their respective resistances.

The following equation:

$$t_f = \frac{l}{AF_f}(\tau_e - t_{bi}AF_{bi})$$

gives the applied burn-in time $t_{bi}$ duration required, given a particular voltage stimulus level, where AF are the given "acceleration factor" for a Burn-In condition where $t_f$ is a total applied burn-in time duration, e.g., a time duration that the new defect type took to manifest as a fail at use conditions, e.g., 90 days) and $\tau_e$ is AF×BI duration at previous conditions to accelerate the new defect while in the factory. In accordance with one embodiment, adaptive modification of the applied parameters may adapt this equation to account for increased duration at specific applied conditions of temperature and voltage to obtain:

$$t_f = \frac{l}{AF_f}(\tau_e - t_{tbi1}AF_{bi1} - t_{tbi2}AF_{bi2})$$

where $t_{bi1}$ is an applied burn-in time duration for a first set of conditions, and $t_{bi2}$ is an applied burn-in time duration for a second (modified) set of conditions. In one example Burn-in condition (e.g., homogenous optimization), $t_{bi1}$ is given 20 Hours (e.g., at an applied high voltage stimulus of 1.65 Volt). However, for defect specific optimization, the 20 Hours burn in time is split: $t_{bi1}$ is given as 3.3 Hours (e.g., at the 1.65 Volt stimulus) however, an additional burn-in condition is modified in a subsequent run where $t_{bi2}$ is 16.67 Hours at a lowered voltage stimulus, e.g., applied 1.265 V stimulus).

Thus for example, given example values for T, ΔT, $t_{bi}$, $t_f$, $\tau_e$, AF, and by applying the formulae above, it may be determined that to catch the defect of FIG. 4, the BI conditions would need to run for greater than 27.1 hours at an applied high voltage stimulus of 1.65 Volt. That is, by applying the principles of the methods of FIGS. 1 and 2, the method reveals an analysis scenario providing a result where an increased duration for Burn-in at specific applied conditions would optimally exercise and accelerate this defect class, e.g., applying a Burn-in condition for 17.4 hours at 2.0 Volts.

Thus, in accordance with one embodiment, adaptive modification of the applied parameters may adapt the applied BI conditions by increasing a BI duration (e.g., 27.1 hours) at specific applied conditions of temperature and voltage.

As an alternate scenario, adaptive modification of the applied parameters may adapt (increase), e.g., increase, the applied BI voltage conditions resulting in a reduction of the BI duration.

FIG. 10 illustrates a schematic of an example computer or processing system that may implement the method to apply the Burn-in process flow conditions and implement unknown defect detection logic in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 10 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 10 that performs the Burn-in process flow, the adaptive modification thereof, and unknown defect detection logic according to the methods described herein. The module 10 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for testing semiconductor products comprising:
    applying, to a semiconductor product, first test voltage and temperature stimuli based on acceleration condition parameters, said parameters comprising a temperature acceleration condition parameter and voltage acceleration condition parameter, at corresponding acceleration condition levels, said first test stimuli for detecting one or more known latent defects in the semiconductor product;
    collecting production results from said applying said first test stimuli;
    applying to said semiconductor product, test stimuli in succession, and varying, at each successive application, one or more of: a temperature acceleration condition parameter, a voltage acceleration condition parameter or both temperature and voltage acceleration condition parameters, each successive application of test stimuli applied for inducing an acceleration of a semiconductor product defect,
    said varying comprising applying, at one or more of said successive applications, a combination of an increased first acceleration condition parameter and/or acceleration condition level and decreasing a second acceleration condition parameter and/or acceleration condition level parameter;
    collecting production results from said applying further test stimuli at each said successive application; and
    detecting, based on said collected production results for each said first and successive application of test stimuli, a previously unknown semiconductor product defect.

2. The method as claimed in claim 1, wherein said detecting a previously unknown semiconductor product defect comprises:
    comparing, at a processor device, said production results collected responsive to said applying said first test stimuli to said semiconductor product against said production results collected responsive to said applying each successive application of further test stimuli, wherein a previously unknown semiconductor product defect is detected based on said comparing.

3. The method as claimed in claim 1, further comprising:
    determining whether the detected previously unknown semiconductor product defect is achievable from applying a known combination of a temperature acceleration condition parameter, a voltage acceleration condition parameter or both temperature and voltage acceleration condition parameters and/or the corresponding acceleration condition level designed to detect a known semiconductor product defect; and
    if the detected previously unknown semiconductor product defect is not achievable from applying the known combination, then integrating the varied combination of an increased first acceleration condition parameter and/or acceleration condition level and decreased second acceleration condition parameter and/or acceleration condition level parameter as an additional test stimuli to be applied when conducting an initial semiconductor product test after manufacture.

4. The method as claimed in claim 1, further comprising:
    obtaining, at a processor device, a first distribution metric representing an amount of detected known defect failures based on tests applied to a plurality of semiconductor products using said applied temperature acceleration condition parameter, voltage acceleration condition parameter or both temperature and voltage acceleration condition parameters and/or the corresponding acceleration condition level designed to detect the known semiconductor product defects;
    obtaining, at the processor device, a second distribution metric representing an amount of detected known defect failures based on said further test stimuli applied to a plurality of semiconductor products using the varied combination of an increased first acceleration condition parameter and/or acceleration condition level and decreased second acceleration condition parameter and/or acceleration condition level parameter;
    comparing the first distribution metric with the second distribution metric to detect a change in a distribution of known defect failures resulting from said varied combination of an increased first acceleration condition parameter and/or acceleration condition level and decreased second acceleration condition parameter and/or acceleration condition level parameter; and
    adaptively modifying, at a successive application, the applied temperature, voltage or both temperature and voltage stimuli based on detecting a change in the distribution of known defect failures.

5. The method as claimed in claim 4, wherein said adaptively modifying said applied temperature, voltage or both temperature and voltage stimuli comprises adjusting by increasing or decreasing a time duration of an applied temperature, voltage or both temperature and voltage stimuli.

6. The method as claimed in claim 5, wherein said adjusting by increasing or decreasing a time duration of an applied temperature, voltage or both temperature and voltage stimuli, or adjusting a pattern of applying said stimuli is performed in real-time during said successive application.

7. The method as claimed in claim 1, wherein said varied combination of an increased first acceleration condition parameter and/or acceleration condition level and decreased second acceleration condition parameter and/or acceleration condition level parameter comprises one of: a high level temperature condition stimulus and low level voltage stimulus applied to said semiconductor product, or a low level temperature condition stimulus and high level voltage stimulus applied to said semiconductor product.

8. An apparatus for testing semiconductor products comprising:
    a processor device;
    a memory storage device storing instructions, said instructions for configuring the processor device to perform a method to:
        control applying, to a semiconductor product, first test voltage and temperature stimuli based on acceleration condition parameters, said parameters comprising a temperature acceleration condition parameter and voltage acceleration condition parameter, at corresponding acceleration condition levels, said first test stimuli for detecting one or more known latent defects in the semiconductor product;
        collect production results from said applying said first test stimuli;

control applying to said semiconductor product, test stimuli in succession, and varying, at each successive application, one or more of: a temperature acceleration condition parameter, a voltage acceleration condition parameter or both temperature and voltage acceleration condition parameters, each successive application of test stimuli applied for inducing an acceleration of a semiconductor product defect, said varying comprising applying, at one or more of said successive applications, a combination of an increased first acceleration condition parameter and/or acceleration condition level and decreasing a second acceleration condition parameter and/or acceleration condition level parameter;

collect production results from said applying further test stimuli at each said successive application; and detect, based on said collected production results for each said first and successive application of test stimuli, a previously unknown semiconductor product defect.

9. The apparatus as claimed in claim 8, wherein to detect a previously unknown semiconductor product defect, the processor device is further configured to:

compare said production results collected responsive to said applying said first test stimuli to said semiconductor product against said production results collected responsive to said applying each successive application of further test stimuli, wherein a previously unknown semiconductor product defect is detected based on said comparing.

10. The apparatus as claimed in claim 8, wherein the processor device is further configured to:

determine whether the detected previously unknown semiconductor product defect is achievable from applying a known combination of a temperature acceleration condition parameter, a voltage acceleration condition parameter or both temperature and voltage acceleration condition parameters and/or the corresponding acceleration condition level designed to detect a known semiconductor product defect; and if the detected previously unknown semiconductor product defect is not achievable from applying the known combination, then integrating the varied combination of an increased first acceleration condition parameter and/or acceleration condition level and decreased second acceleration condition parameter and/or acceleration condition level parameter as an additional test stimuli to be applied when conducting an initial semiconductor product test after manufacture.

11. The apparatus as claimed in claim 8, wherein the processor device is further configured to:

obtain a first distribution metric representing an amount of detected known defect failures based on tests applied to a plurality of semiconductor products using said applied temperature acceleration condition parameter, voltage acceleration condition parameter or both temperature and voltage acceleration condition parameters and/or the corresponding acceleration condition level designed to detect the known semiconductor product defects;

obtain a second distribution metric representing an amount of detected known defect failures based on said further test stimuli applied to a plurality of semiconductor products using the varied combination of an increased first acceleration condition parameter and/or acceleration condition level and decreased second acceleration condition parameter and/or acceleration condition level parameter;

compare the first distribution metric with the second distribution metric to detect a change in a distribution of known defect failures resulting from said varied combination of an increased first acceleration condition parameter and/or acceleration condition level and decreased second acceleration condition parameter and/or acceleration condition level parameter; and adaptively modify, at a successive application, the applied temperature, voltage or both temperature and voltage stimuli based on detecting a change in the distribution of known defect failures.

12. The apparatus as claimed in claim 11, wherein to adaptively modify said applied temperature, voltage or both temperature and voltage stimuli comprises, said processor device if further configured to adjust by increasing or decreasing a time duration of an applied temperature, voltage or both temperature and voltage stimuli.

13. The apparatus as claimed in claim 12, wherein said adjusting by increasing or decreasing a time duration of an applied temperature, voltage or both temperature and voltage stimuli, or adjusting a pattern of applying said stimuli is performed in real-time during said successive application.

14. The apparatus as claimed in claim 8, wherein said varied combination of an increased first acceleration condition parameter and/or acceleration condition level and decreased second acceleration condition parameter and/or acceleration condition level parameter comprises one of:

a high level temperature condition stimulus and low level voltage stimulus applied to said semiconductor product, or a low level temperature condition stimulus and high level voltage stimulus applied to said semiconductor product.

15. A computer program product comprising:

a non-transitory computer readable media embodying a program of instructions executable by a processing unit for testing a semiconductor product, the program of instructions, when executing, performing a method comprising:

applying, to a semiconductor product, first test voltage and temperature stimuli based on acceleration condition parameters, said parameters comprising a temperature acceleration condition parameter and voltage acceleration condition parameter, at corresponding acceleration condition levels, said first test stimuli for detecting one or more known latent defects in the semiconductor product;

collecting production results from said applying said first test stimuli;

applying to said semiconductor product, test stimuli in succession, and varying, at each successive application, one or more of: a temperature acceleration condition parameter, a voltage acceleration condition parameter or both temperature and voltage acceleration condition parameters, each successive application of test stimuli applied for inducing an acceleration of a semiconductor product defect, said varying comprising applying, at one or more of said successive applications, a combination of an increased first acceleration condition parameter and/or acceleration condition level and decreasing a second acceleration condition parameter and/or acceleration condition level parameter;

collecting production results from said applying further test stimuli at each said successive application; and detecting, based on said collected production results for each said first and successive application of test stimuli, a previously unknown semiconductor product defect.

16. The computer program product as claimed in claim 15, wherein said detecting a previously unknown semiconductor product defect comprises:
comparing, at a processor device, said production results collected responsive to said applying said first test stimuli to said semiconductor product against said production results collected responsive to said applying each successive application of further test stimuli, wherein a previously unknown semiconductor product defect is detected based on said comparing.

17. The computer program product as claimed in claim 15, further comprising:
determining whether the detected previously unknown semiconductor product defect is achievable from applying a known combination of a temperature acceleration condition parameter, a voltage acceleration condition parameter or both temperature and voltage acceleration condition parameters and/or the corresponding acceleration condition level designed to detect a known semiconductor product defect; and
if the detected previously unknown semiconductor product defect is not achievable from applying the known combination, then integrating the varied combination of an increased first acceleration condition parameter and/or acceleration condition level and decreased second acceleration condition parameter and/or acceleration condition level parameter as an additional test stimuli to be applied when conducting an initial semiconductor product test after manufacture.

18. The computer program product as claimed in claim 15, further comprising:
obtaining, at a processor device, a first distribution metric representing an amount of detected known defect failures based on tests applied to a plurality of semiconductor products using said applied temperature acceleration condition parameter, voltage acceleration condition parameter or both temperature and voltage acceleration condition parameters and/or the corresponding acceleration condition level designed to detect the known semiconductor product defects;
obtaining, at the processor device, a second distribution metric representing an amount of detected known defect failures based on said further test stimuli applied to a plurality of semiconductor products using the varied combination of an increased first acceleration condition parameter and/or acceleration condition level and decreased second acceleration condition parameter and/or acceleration condition level parameter;
comparing the first distribution metric with the second distribution metric to detect a change in a distribution of known defect failures resulting from said varied combination of an increased first acceleration condition parameter and/or acceleration condition level and decreased second acceleration condition parameter and/or acceleration condition level parameter; and
adaptively modifying, at a successive application, the applied temperature, voltage or both temperature and voltage stimuli based on detecting a change in the distribution of known defect failures.

19. The computer program product as claimed in claim 18, wherein said adaptively modifying said applied temperature, voltage or both temperature and voltage stimuli comprises adjusting by increasing or decreasing a time duration of an applied temperature, voltage or both temperature and voltage stimuli.

20. The computer program product as claimed in claim 19, wherein said adjusting by increasing or decreasing a time duration of an applied temperature, voltage or both temperature and voltage stimuli, or adjusting a pattern of applying said stimuli is performed in real-time during said successive application.

* * * * *